(12) United States Patent
Resch (10) Patent No.: US 10,594,793 B2
(45) Date of Patent: Mar. 17, 2020

(54) READ-PREPARE REQUESTS TO MULTIPLE MEMORIES

(71) Applicant: International Business Machines Corporation, Armonk, NY (US)

(72) Inventor: Jason K. Resch, Chicago, IL (US)

(73) Assignee: PURE STORAGE, INC., Mountain View, CA (US)

( * ) Notice: Subject to any disclaimer, the term of this patent is extended or adjusted under 35 U.S.C. 154(b) by 0 days.

(21) Appl. No.: 15/841,936

(22) Filed: Dec. 14, 2017

(65) Prior Publication Data

US 2018/0109615 A1    Apr. 19, 2018

Related U.S. Application Data

(63) Continuation-in-part of application No. 15/812,706, filed on Nov. 14, 2017, now Pat. No. 10,362,111,
(Continued)

(51) Int. Cl.
*H04L 1/00* (2006.01)
*H04L 29/08* (2006.01)
(Continued)

(52) U.S. Cl.
CPC ...... *H04L 67/1097* (2013.01); *G06F 11/1076* (2013.01); *H04L 67/10* (2013.01);
(Continued)

(58) Field of Classification Search
CPC ................. H04L 67/1097; H04L 67/10; H04L 29/08549; H04L 67/2842; H03M 13/3761;
(Continued)

(56) References Cited

U.S. PATENT DOCUMENTS 4,092,732 A    5/1978 Ouchi
5,454,101 A    9/1995 Mackay et al.
(Continued)

OTHER PUBLICATIONS

Chung; An Automatic Data Segmentation Method for 3D Measured Data Points; National Taiwan University; pp. 1-8; 1998.
(Continued)

*Primary Examiner* — Albert Decady
*Assistant Examiner* — Osman M Alshack
(74) *Attorney, Agent, or Firm* — Garlick & Markison; Edward J. Marshall (57) ABSTRACT

A distributed storage network (DSN) employs multiple storage units, each of which includes distributed storage (DS) memories for dispersed storage of encoded data slices. A requesting device transmits a read-prepare request specifying a slice name to the storage units, and instructs the storage units to attempt to retrieve, one or more data slices associated with the slice name from dispersed storage, and to temporarily store the one or more data slices in a memory, rather than transmitting them to the requesting device. The requesting device receives read-prepare responses from the storage units. The read-prepare responses include either an error indication indicating that the storage unit was unable to retrieve one or more valid data slices from dispersed storage, or names and revisions of valid data slices actually retrieved. The requesting device selects a subset of the storage units based on the read-prepare responses, and transmits a read-complete request to them.

20 Claims, 7 Drawing Sheets

Related U.S. Application Data which is a continuation of application No. 14/956,818, filed on Dec. 2, 2015, now Pat. No. 9,826,038.

(60) Provisional application No. 62/109,712, filed on Jan. 30, 2015.

(51) Int. Cl.
*G06F 11/10* (2006.01)
*H03M 13/37* (2006.01)
*H03M 13/15* (2006.01)
*H03M 13/09* (2006.01)

(52) U.S. Cl.
CPC ........ *H03M 13/09* (2013.01); *H03M 13/1515* (2013.01); *H03M 13/3761* (2013.01)

(58) Field of Classification Search
CPC .............. H03M 13/09; H03M 13/1515; G11B 2220/412
USPC ................................. 714/718, 719, 759, 763
See application file for complete search history.

(56) References Cited

U.S. PATENT DOCUMENTS

| | | |
|---|---|---|
| 5,485,474 A | 1/1996 | Rabin |
| 5,774,643 A | 6/1998 | Lubbers et al. |
| 5,802,364 A | 9/1998 | Senator et al. |
| 5,809,285 A | 9/1998 | Hilland |
| 5,890,156 A | 3/1999 | Rekieta et al. |
| 5,987,622 A | 11/1999 | Lo Verso et al. |
| 5,991,414 A | 11/1999 | Garay et al. |
| 6,012,159 A | 1/2000 | Fischer et al. |
| 6,058,454 A | 5/2000 | Gerlach et al. |
| 6,128,277 A | 10/2000 | Bruck et al. |
| 6,175,571 B1 | 1/2001 | Haddock et al. |
| 6,192,472 B1 | 2/2001 | Garay et al. |
| 6,256,688 B1 | 7/2001 | Suetaka et al. |
| 6,272,658 B1 | 8/2001 | Steele et al. |
| 6,301,604 B1 | 10/2001 | Nojima |
| 6,356,949 B1 | 3/2002 | Katsandres et al. |
| 6,366,995 B1 | 4/2002 | Vilkov et al. |
| 6,374,336 B1 | 4/2002 | Peters et al. |
| 6,415,373 B1 | 7/2002 | Peters et al. |
| 6,418,539 B1 | 7/2002 | Walker |
| 6,449,688 B1 | 9/2002 | Peters et al. |
| 6,567,948 B2 | 5/2003 | Steele et al. |
| 6,571,282 B1 | 5/2003 | Bowman-Amuah |
| 6,609,223 B1 | 8/2003 | Wolfgang |
| 6,718,361 B1 | 4/2004 | Basani et al. |
| 6,760,808 B2 | 7/2004 | Peters et al. |
| 6,785,768 B2 | 8/2004 | Peters et al. |
| 6,785,783 B2 | 8/2004 | Buckland |
| 6,826,711 B2 | 11/2004 | Moulton et al. |
| 6,879,596 B1 | 4/2005 | Dooply |
| 7,003,688 B1 | 2/2006 | Pittelkow et al. |
| 7,024,451 B2 | 4/2006 | Jorgenson |
| 7,024,609 B2 | 4/2006 | Wolfgang et al. |
| 7,080,101 B1 | 7/2006 | Watson et al. |
| 7,103,824 B2 | 9/2006 | Halford |
| 7,103,915 B2 | 9/2006 | Redlich et al. |
| 7,111,115 B2 | 9/2006 | Peters et al. |
| 7,140,044 B2 | 11/2006 | Redlich et al. |
| 7,146,644 B2 | 12/2006 | Redlich et al. |
| 7,171,493 B2 | 1/2007 | Shu et al. |
| 7,222,133 B1 | 5/2007 | Raipurkar et al. |
| 7,240,236 B2 | 7/2007 | Cutts et al. |
| 7,272,613 B2 | 9/2007 | Sim et al. |
| 7,636,724 B2 | 12/2009 | de la Torre et al. |
| 2002/0062422 A1 | 5/2002 | Butterworth et al. |
| 2002/0166079 A1 | 11/2002 | Ulrich et al. |
| 2003/0018927 A1 | 1/2003 | Gadir et al. |
| 2003/0037261 A1 | 2/2003 | Meffert et al. |
| 2003/0065617 A1 | 4/2003 | Watkins et al. |
| 2003/0084020 A1 | 5/2003 | Shu |
| 2004/0024963 A1 | 2/2004 | Talagala et al. |
| 2004/0122917 A1 | 6/2004 | Menon et al. |
| 2004/0215998 A1 | 10/2004 | Buxton et al. |
| 2004/0228493 A1 | 11/2004 | Ma |
| 2005/0100022 A1 | 5/2005 | Ramprashad |
| 2005/0114594 A1 | 5/2005 | Corbett et al. |
| 2005/0125593 A1 | 6/2005 | Karpoff et al. |
| 2005/0131993 A1 | 6/2005 | Fatula |
| 2005/0132070 A1 | 6/2005 | Redlich et al. |
| 2005/0144382 A1 | 6/2005 | Schmisseur |
| 2005/0229069 A1 | 10/2005 | Hassner et al. |
| 2006/0047907 A1 | 3/2006 | Shiga et al. |
| 2006/0136448 A1 | 6/2006 | Cialini et al. |
| 2006/0156059 A1 | 7/2006 | Kitamura |
| 2006/0224603 A1 | 10/2006 | Correll |
| 2007/0079081 A1 | 4/2007 | Gladwin et al. |
| 2007/0079082 A1 | 4/2007 | Gladwin et al. |
| 2007/0079083 A1 | 4/2007 | Gladwin et al. |
| 2007/0088970 A1 | 4/2007 | Buxton et al. |
| 2007/0174192 A1 | 7/2007 | Gladwin et al. |
| 2007/0214285 A1 | 9/2007 | Au et al. |
| 2007/0234110 A1 | 10/2007 | Soran et al. |
| 2007/0283167 A1 | 12/2007 | Venters et al. |
| 2009/0094251 A1 | 4/2009 | Gladwin et al. |
| 2009/0094318 A1 | 4/2009 | Gladwin et al. |
| 2009/0323412 A1* | 12/2009 | Mokhlesi ............ G11C 11/5642 365/185.02 |
| 2010/0023524 A1 | 1/2010 | Gladwin et al. |
| 2011/0071988 A1* | 3/2011 | Resch ................. G06F 11/1076 707/691 |
| 2011/0072321 A1* | 3/2011 | Dhuse ................. G06F 11/1076 714/55 |
| 2011/0231733 A1* | 9/2011 | Cilfone ............... G06F 11/1076 714/763 |
| 2012/0166757 A1* | 6/2012 | Volvovski ........... G06F 11/1076 711/206 |
| 2012/0198066 A1* | 8/2012 | Grube ................. H04L 67/1097 709/225 |
| 2012/0226933 A1* | 9/2012 | Baptist ................ G06F 11/0727 714/6.2 |
| 2013/0232503 A1* | 9/2013 | Volvovski ........... G06F 11/1044 718/104 |
| 2013/0238900 A1* | 9/2013 | Leggette ............. H04L 63/0428 713/165 |
| 2013/0275776 A1* | 10/2013 | Baptist ................ H04L 67/1097 713/193 |
| 2013/0304745 A1* | 11/2013 | Dhuse ................. G06F 16/2272 707/741 |
| 2013/0304746 A1* | 11/2013 | Dhuse .................. G06F 16/322 707/743 |
| 2014/0026017 A1* | 1/2014 | Grube ................. G06F 16/182 714/770 |
| 2015/0227414 A1 | 8/2015 | Varma |
| 2016/0093372 A1* | 3/2016 | Fainzilber ........... G11C 11/5642 714/764 |
| 2016/0117219 A1 | 4/2016 | Halbert et al. |

OTHER PUBLICATIONS

Harrison; Lightweight Directory Access Protocol (LDAP): Authentication Methods and Security Mechanisms; IETF Network Working Group; RFC 4513; Jun. 2006; pp. 1-32.

Kubiatowicz, et al.; OceanStore: An Architecture for Global-Scale Persistent Storage; Proceedings of the Ninth International Conference on Architectural Support for Programming Languages and Operating Systems (ASPLOS 2000); Nov. 2000; pp. 1-12.

Legg; Lightweight Directory Access Protocol (LDAP): Syntaxes and Matching Rules; IETF Network Working Group; RFC 4517; Jun. 2006; pp. 1-50.

Plank, T1: Erasure Codes for Storage Applications; FAST2005, 4th Usenix Conference on File Storage Technologies; Dec. 13-16, 2005; pp. 1-74.

Rabin; Efficient Dispersal of Information for Security, Load Balancing, and Fault Tolerance; Journal of the Association for Computer Machinery; vol. 36, No. 2; Apr. 1989; pp. 335-348.

(56) References Cited

OTHER PUBLICATIONS

Satran, et al.; Internet Small Computer Systems Interface (iSCSI); IETF Network Working Group; RFC 3720; Apr. 2004; pp. 1-257.
Sciberras; Lightweight Directory Access Protocol (LDAP): Schema for User Applications; IETF Network Working Group; RFC 4519; Jun. 2006; pp. 1-33.
Sermersheim; Lightweight Directory Access Protocol (LDAP): The Protocol; IETF Network Working Group; RFC 4511; Jun. 2006; pp. 1-68.
Shamir; How to Share a Secret; Communications of the ACM; vol. 22, No. 11; Nov. 1979; pp. 612-613.
Smith; Lightweight Directory Access Protocol (LDAP): String Representation of Search Filters; IETF Network Working Group; RFC 4515; Jun. 2006; pp. 1-12.
Smith; Lightweight Directory Access Protocol (LDAP): Uniform Resource Locator; IETF Network Working Group; RFC 4516; Jun. 2006; pp. 1-15.
Wildi; Java iSCSi Initiator; Master Thesis; Department of Computer and Information Science, University of Konstanz; Feb. 2007; 60 pgs.
Xin, et al.; Evaluation of Distributed Recovery in Large-Scale Storage Systems; 13th IEEE International Symposium on High Performance Distributed Computing; Jun. 2004; pp. 172-181.
Zeilenga; Lightweight Directory Access Protocol (LDAP): Internationalized String Preparation; IETF Network Working Group; RFC 4518; Jun. 2006; pp. 1-14.
Zeilenga; Lightweight Directory Access Protocol (LDAP): Technical Specification Road Map; IETF Network Working Group; RFC 4510; Jun. 2006; pp. 1-8.
Zeilenga; Lightweight Directory Access Protocol (LDAP): Directory Information Models; IETF Network Working Group; RFC 4512; Jun. 2006; pp. 1-49.
Zeilenga; Lightweight Directory Access Protocol (LDAP): String Representation of Distinguished Names; IETF Network Working Group; RFC 4514; Jun. 2006; pp. 1-15.

\* cited by examiner

READ-PREPARE REQUESTS TO MULTIPLE MEMORIES

CROSS-REFERENCE TO RELATED APPLICATIONS

The present U.S. Utility patent application claims priority pursuant to 35 U.S.C. § 120 as a continuation-in-part of U.S. Utility application Ser. No. 15/812,706 entitled "SELECTING A DATA STORAGE RESOURCE OF A DISPERSED STORAGE NETWORK" filed Nov. 14, 2017, which claims priority pursuant to 35 U.S.C. § 120 as a continuation of U.S. Utility application Ser. No. 14/956,818 entitled "SELECTING A DATA STORAGE RESOURCE OF A DISPERSED STORAGE NETWORK" filed Dec. 2, 2015, now U.S. Pat. No. 9,826,038 issued on Nov. 21, 2017, which claims priority pursuant to 35 U.S.C. § 119(e) to U.S. Provisional Application No. 62/109,712, entitled "UTILIZING ALTERNATE STORAGE RESOURCES WITHIN A DISPERSED STORAGE NETWORK," filed Jan. 30, 2015, all of which are hereby incorporated herein by reference in their entirety and made part of the present U.S. Utility patent application for all purposes.

BACKGROUND

Technical Field

This invention relates generally to computer networks and more particularly to dispersing error encoded data.

Description of Related Art

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function. For example, Hadoop is an open source software framework that supports distributed applications enabling application execution by thousands of computers.

In addition to cloud computing, a computer may use "cloud storage" as part of its memory system. As is known, cloud storage enables a user, via its computer, to store files, applications, etc. on an Internet storage system. The Internet storage system may include a RAID (redundant array of independent disks) system and/or a dispersed storage system that uses an error correction scheme to encode data for storage.

In most conventional data storage systems, a request to read data out of a memory in which the data is stored operates by instructing the memory to implement a read operation, which causes the memory to retrieve the data and attempt to transmit it in accordance with the request. Today, there exists the problem that reads to some data stores may fail either because they don't have data, or don't have data at the correct revision; this wastes not only time, but also bandwidth. An approach that minimizes bandwidth, is to issue Check requests to all the stores first, then to issue read requests only to those ds units that are available and have data at the correct revision, but data may change between the check and the read, for example if a write is ongoing. Additionally, memory device failures can occur or be present, and these device failures can cause the check to succeed but the read to fail.

DETAILED DESCRIPTION

Figure 1:
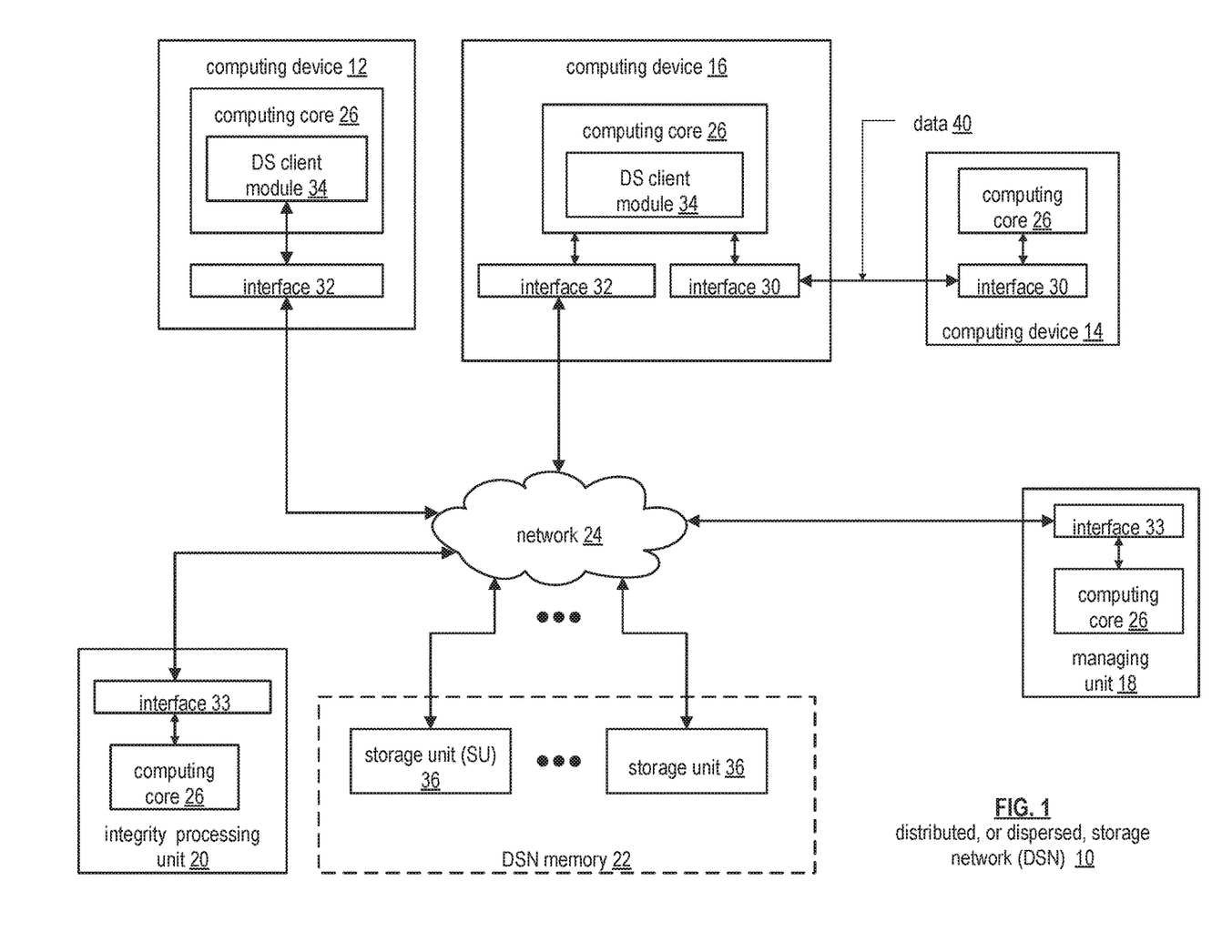
FIG. 1 is a schematic block diagram of an embodiment of a dispersed or distributed storage network (DSN) in accordance with the present invention.

FIG. 1 is a schematic block diagram of an embodiment of a dispersed, or distributed, storage network (DSN) 10 that includes a plurality of computing devices 12-16, a managing unit 18, an integrity processing unit 20, and a DSN memory 22. The components of the DSN 10 are coupled to a network 24, which may include one or more wireless and/or wire lined communication systems; one or more non-public intranet systems and/or public internet systems; and/or one or more local area networks (LAN) and/or wide area networks (WAN).

Figure 2:
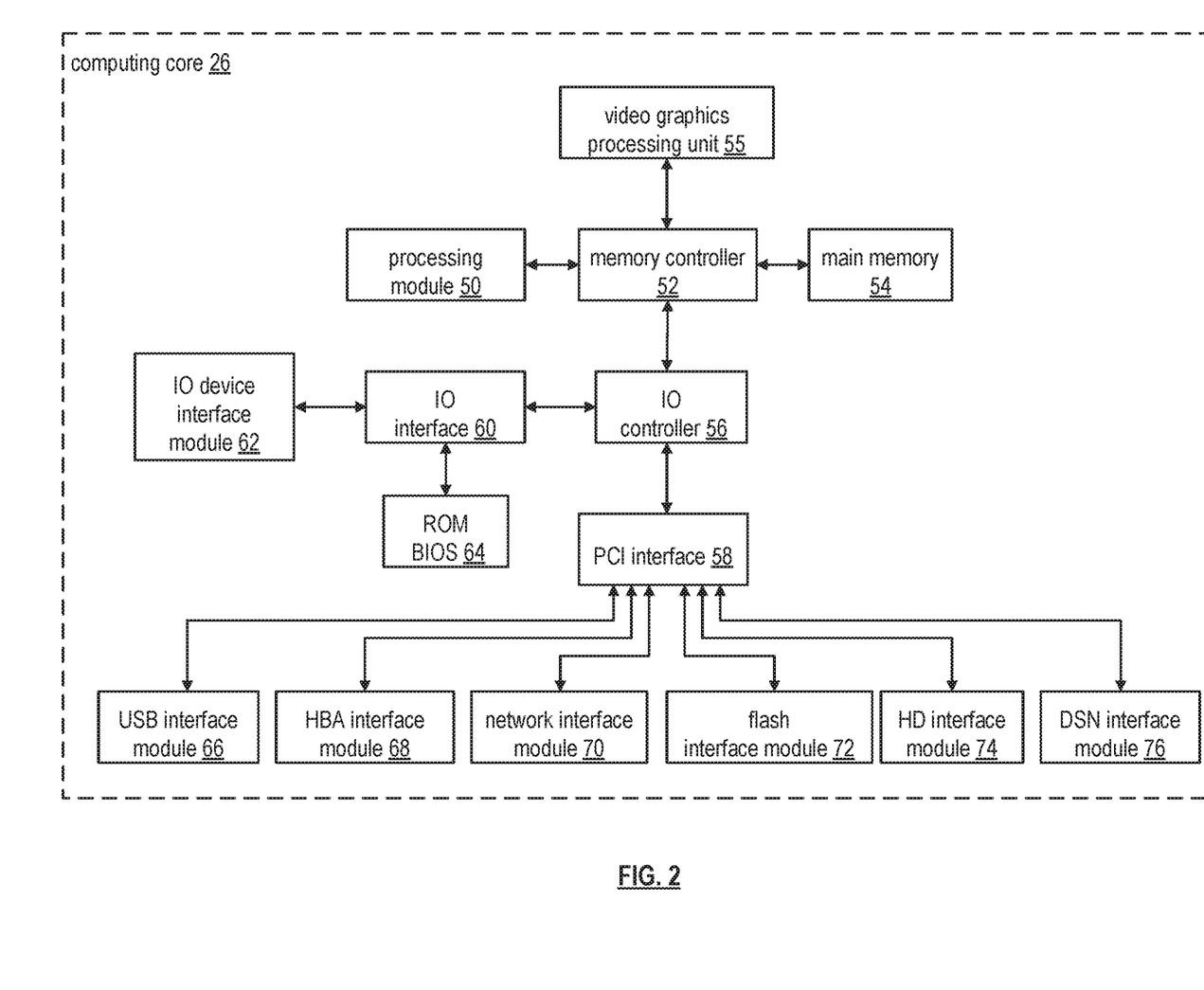
FIG. 2 is a schematic block diagram of an embodiment of a computing core in accordance with the present invention.

The DSN memory 22 includes a plurality of storage units 36 that may be located at geographically different sites (e.g., one in Chicago, one in Milwaukee, etc.), at a common site, or a combination thereof. For example, if the DSN memory 22 includes eight storage units 36, each storage unit is located at a different site. As another example, if the DSN memory 22 includes eight storage units 36, all eight storage units are located at the same site. As yet another example, if the DSN memory 22 includes eight storage units 36, a first pair of storage units are at a first common site, a second pair of storage units are at a second common site, a third pair of storage units are at a third common site, and a fourth pair of storage units are at a fourth common site. Note that a DSN memory 22 may include more or less than eight storage units 36. Further note that each storage unit 36 includes a computing core (as shown in FIG. 2, or components thereof) and a plurality of memory devices for storing dispersed error encoded data.

Each of the computing devices 12-16, the managing unit 18, and the integrity processing unit 20 include a computing core 26, which includes network interfaces 30-33. Computing devices 12-16 may each be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. Note that each of the managing unit 18 and the integrity processing unit 20 may be separate computing devices, may be a common computing device, and/or may be integrated into one or more of the computing devices 12-16 and/or into one or more of the storage units 36.

Each interface 30, 32, and 33 includes software and hardware to support one or more communication links via the network 24 indirectly and/or directly. For example, interface 30 supports a communication link (e.g., wired, wireless, direct, via a LAN, via the network 24, etc.) between computing devices 14 and 16. As another example, interface 32 supports communication links (e.g., a wired connection, a wireless connection, a LAN connection, and/or any other type of connection to/from the network 24) between computing devices 12 and 16 and the DSN memory 22. As yet another example, interface 33 supports a communication link for each of the managing unit 18 and the integrity processing unit 20 to the network 24.

Computing devices 12 and 16 include a dispersed storage (DS) client module 34, which enables the computing device to dispersed storage error encode and decode data (e.g., data 40) as subsequently described with reference to one or more of FIGS. 3-8. In this example embodiment, computing device 16 functions as a dispersed storage processing agent for computing device 14. In this role, computing device 16 dispersed storage error encodes and decodes data on behalf of computing device 14. With the use of dispersed storage error encoding and decoding, the DSN 10 is tolerant of a significant number of storage unit failures (the number of failures is based on parameters of the dispersed storage error encoding function) without loss of data and without the need for a redundant or backup copies of the data. Further, the DSN 10 stores data for an indefinite period of time without data loss and in a secure manner (e.g., the system is very resistant to unauthorized attempts at accessing the data).

In operation, the managing unit 18 performs DS management services. For example, the managing unit 18 establishes distributed data storage parameters (e.g., vault creation, distributed storage parameters, security parameters, billing information, user profile information, etc.) for computing devices 12-14 individually or as part of a group of user devices. As a specific example, the managing unit 18 coordinates creation of a vault (e.g., a virtual memory block associated with a portion of an overall namespace of the DSN) within the DSN memory 22 for a user device, a group of devices, or for public access and establishes per vault dispersed storage (DS) error encoding parameters for a vault. The managing unit 18 facilitates storage of DS error encoding parameters for each vault by updating registry information of the DSN 10, where the registry information may be stored in the DSN memory 22, a computing device 12-16, the managing unit 18, and/or the integrity processing unit 20.

The managing unit 18 creates and stores user profile information (e.g., an access control list (ACL)) in local memory and/or within memory of the DSN memory 22. The user profile information includes authentication information, permissions, and/or the security parameters. The security parameters may include encryption/decryption scheme, one or more encryption keys, key generation scheme, and/or data encoding/decoding scheme.

The managing unit 18 creates billing information for a particular user, a user group, a vault access, public vault access, etc. For instance, the managing unit 18 tracks the number of times a user accesses a non-public vault and/or public vaults, which can be used to generate a per-access billing information. In another instance, the managing unit 18 tracks the amount of data stored and/or retrieved by a user device and/or a user group, which can be used to generate a per-data-amount billing information.

As another example, the managing unit 18 performs network operations, network administration, and/or network maintenance. Network operations includes authenticating user data allocation requests (e.g., read and/or write requests), managing creation of vaults, establishing authentication credentials for user devices, adding/deleting components (e.g., user devices, storage units, and/or computing devices with a DS client module 34) to/from the DSN 10, and/or establishing authentication credentials for the storage units 36. Network administration includes monitoring devices and/or units for failures, maintaining vault information, determining device and/or unit activation status, determining device and/or unit loading, and/or determining any other system level operation that affects the performance level of the DSN 10. Network maintenance includes facilitating replacing, upgrading, repairing, and/or expanding a device and/or unit of the DSN 10.

The integrity processing unit 20 performs rebuilding of 'bad' or missing encoded data slices. At a high level, the integrity processing unit 20 performs rebuilding by periodically attempting to retrieve/list encoded data slices, and/or slice names of the encoded data slices, from the DSN memory 22. For retrieved encoded slices, they are checked for errors due to data corruption, outdated version, etc. If a slice includes an error, it is flagged as a 'bad' slice. For encoded data slices that were not received and/or not listed, they are flagged as missing slices. Bad and/or missing slices are subsequently rebuilt using other retrieved encoded data slices that are deemed to be good slices to produce rebuilt slices. The rebuilt slices are stored in the DSN memory 22.

FIG. 2 is a schematic block diagram of an embodiment of a computing core 26 that includes a processing module 50, a memory controller 52, main memory 54, a video graphics processing unit 55, an input/output (IO) controller 56, a peripheral component interconnect (PCI) interface 58, an IO interface module 60, at least one IO device interface module 62, a read only memory (ROM) basic input output system (BIOS) 64, and one or more memory interface modules. The one or more memory interface module(s) includes one or more of a universal serial bus (USB) interface module 66, a host bus adapter (HBA) interface module 68, a network interface module 70, a flash interface module 72, a hard drive interface module 74, and a DSN interface module 76.

The DSN interface module 76 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). The DSN interface module 76 and/or the network interface module 70 may function as one or more of the interface 30-33 of FIG. 1. Note that the IO device interface module 62 and/or the memory interface modules 66-76 may be collectively or individually referred to as IO ports.

Figures 3, 4:
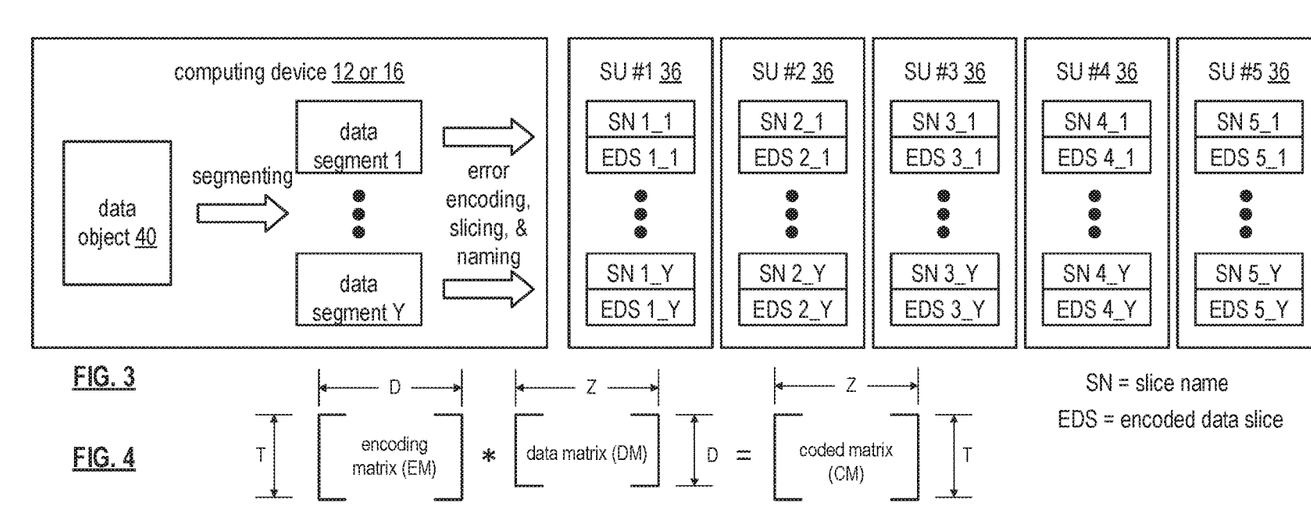
FIG. 3 is a schematic block diagram of an example of dispersed storage error encoding of data in accordance with the present invention.
FIG. 4 is a schematic block diagram of a generic example of an error encoding function in accordance with the present invention.

FIG. 3 is a schematic block diagram of an example of dispersed storage error encoding of data. When a computing device 12 or 16 has data to store it disperse storage error encodes the data in accordance with a dispersed storage error encoding process based on dispersed storage error encoding parameters. The dispersed storage error encoding parameters include an encoding function (e.g., information dispersal algorithm, Reed-Solomon, Cauchy Reed-Solomon, systematic encoding, non-systematic encoding, on-line codes, etc.), a data segmenting protocol (e.g., data segment size, fixed, variable, etc.), and per data segment encoding values. The per data segment encoding values include a total, or pillar width, number (T) of encoded data slices per encoding of a data segment (i.e., in a set of encoded data slices); a decode threshold number (D) of encoded data slices of a set of encoded data slices that are needed to recover the data segment; a read threshold number (R) of encoded data slices to indicate a number of encoded data slices per set to be read from storage for decoding of the data segment; and/or a write threshold number (W) to indicate a number of encoded data slices per set that must be accurately stored before the encoded data segment is deemed to have been properly stored. The dispersed storage error encoding parameters may further include slicing information (e.g., the number of encoded data slices that will be created for each data segment) and/or slice security information (e.g., per encoded data slice encryption, compression, integrity checksum, etc.).

Figure 5:
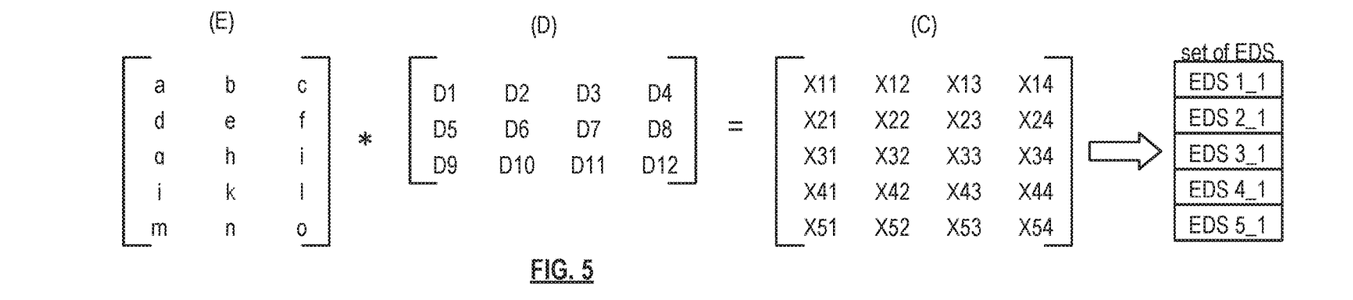
FIG. 5 is a schematic block diagram of a specific example of an error encoding function in accordance with the present invention.

In the present example, Cauchy Reed-Solomon has been selected as the encoding function (a generic example is shown in FIG. 4 and a specific example is shown in FIG. 5); the data segmenting protocol is to divide the data object into fixed sized data segments; and the per data segment encoding values include: a pillar width of 5, a decode threshold of 3, a read threshold of 4, and a write threshold of 4. In accordance with the data segmenting protocol, the computing device 12 or 16 divides the data (e.g., a file (e.g., text, video, audio, etc.), a data object, or other data arrangement) into a plurality of fixed sized data segments (e.g., 1 through Y of a fixed size in range of Kilo-bytes to Tera-bytes or more). The number of data segments created is dependent of the size of the data and the data segmenting protocol.

The computing device 12 or 16 then disperse storage error encodes a data segment using the selected encoding function (e.g., Cauchy Reed-Solomon) to produce a set of encoded data slices. FIG. 4 illustrates a generic Cauchy Reed-Solomon encoding function, which includes an encoding matrix (EM), a data matrix (DM), and a coded matrix (CM). The size of the encoding matrix (EM) is dependent on the pillar width number (T) and the decode threshold number (D) of selected per data segment encoding values. To produce the data matrix (DM), the data segment is divided into a plurality of data blocks and the data blocks are arranged into D number of rows with Z data blocks per row. Note that Z is a function of the number of data blocks created from the data segment and the decode threshold number (D). The coded matrix is produced by matrix multiplying the data matrix by the encoding matrix.

FIG. 5 illustrates a specific example of Cauchy Reed-Solomon encoding with a pillar number (T) of five and decode threshold number of three. In this example, a first data segment is divided into twelve data blocks (D1-D12). The coded matrix includes five rows of coded data blocks, where the first row of X11-X14 corresponds to a first encoded data slice (EDS 1_1), the second row of X21-X24 corresponds to a second encoded data slice (EDS 2_1), the third row of X31-X34 corresponds to a third encoded data slice (EDS 3_1), the fourth row of X41-X44 corresponds to a fourth encoded data slice (EDS 4_1), and the fifth row of X51-X54 corresponds to a fifth encoded data slice (EDS 5_1). Note that the second number of the EDS designation corresponds to the data segment number.

Figure 6:
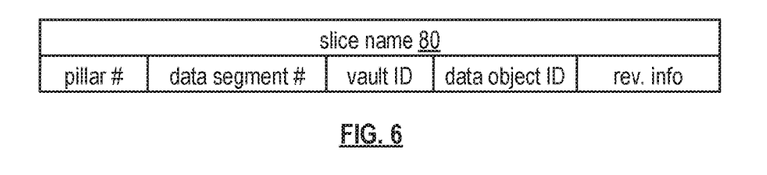
FIG. 6 is a schematic block diagram of an example of a slice name of an encoded data slice (EDS) in accordance with the present invention.

Returning to the discussion of FIG. 3, the computing device also creates a slice name (SN) for each encoded data slice (EDS) in the set of encoded data slices. A typical format for a slice name 80 is shown in FIG. 6. As shown, the slice name (SN) 80 includes a pillar number of the encoded data slice (e.g., one of 1-T), a data segment number (e.g., one of 1-Y), a vault identifier (ID), a data object identifier (ID), and may further include revision level information of the encoded data slices. The slice name functions as, at least part of, a DSN address for the encoded data slice for storage and retrieval from the DSN memory 22.

As a result of encoding, the computing device 12 or 16 produces a plurality of sets of encoded data slices, which are provided with their respective slice names to the storage units for storage. As shown, the first set of encoded data slices includes EDS 1_1 through EDS 5_1 and the first set of slice names includes SN 1_1 through SN 5_1 and the last set of encoded data slices includes EDS 1_Y through EDS 5_Y and the last set of slice names includes SN 1_Y through SN 5_Y.

Figure 7:
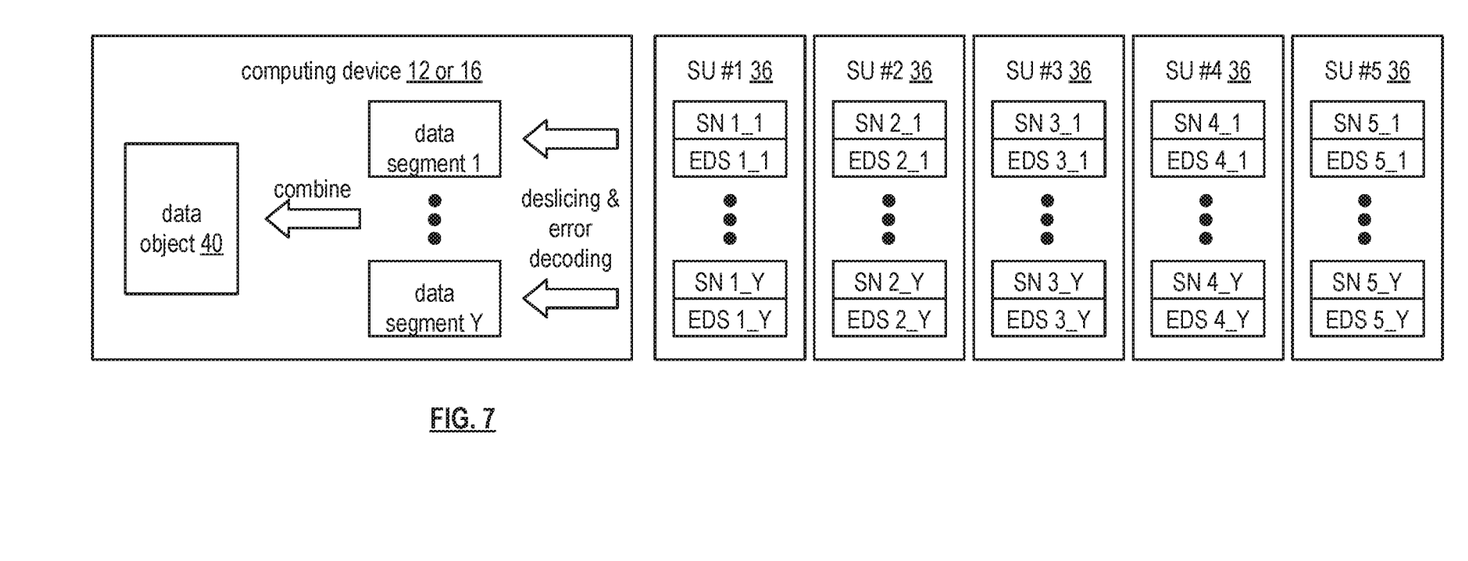
FIG. 7 is a schematic block diagram of an example of dispersed storage error decoding of data in accordance with the present invention.

FIG. 7 is a schematic block diagram of an example of dispersed storage error decoding of a data object that was dispersed storage error encoded and stored in the example of FIG. 4. In this example, the computing device 12 or 16 retrieves from the storage units at least the decode threshold number of encoded data slices per data segment. As a specific example, the computing device retrieves a read threshold number of encoded data slices.

Figure 8:
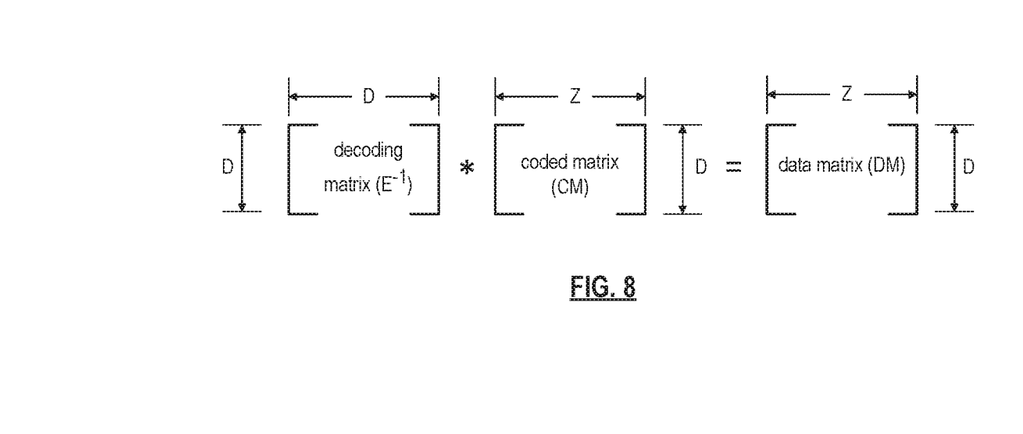
FIG. 8 is a schematic block diagram of a generic example of an error decoding function in accordance with the present invention.

To recover a data segment from a decode threshold number of encoded data slices, the computing device uses a decoding function as shown in FIG. 8. As shown, the decoding function is essentially an inverse of the encoding function of FIG. 4. The coded matrix includes a decode threshold number of rows (e.g., three in this example) and the decoding matrix in an inversion of the encoding matrix that includes the corresponding rows of the coded matrix. For example, if the coded matrix includes rows 1, 2, and 4, the encoding matrix is reduced to rows 1, 2, and 4, and then inverted to produce the decoding matrix.

Figure 9:
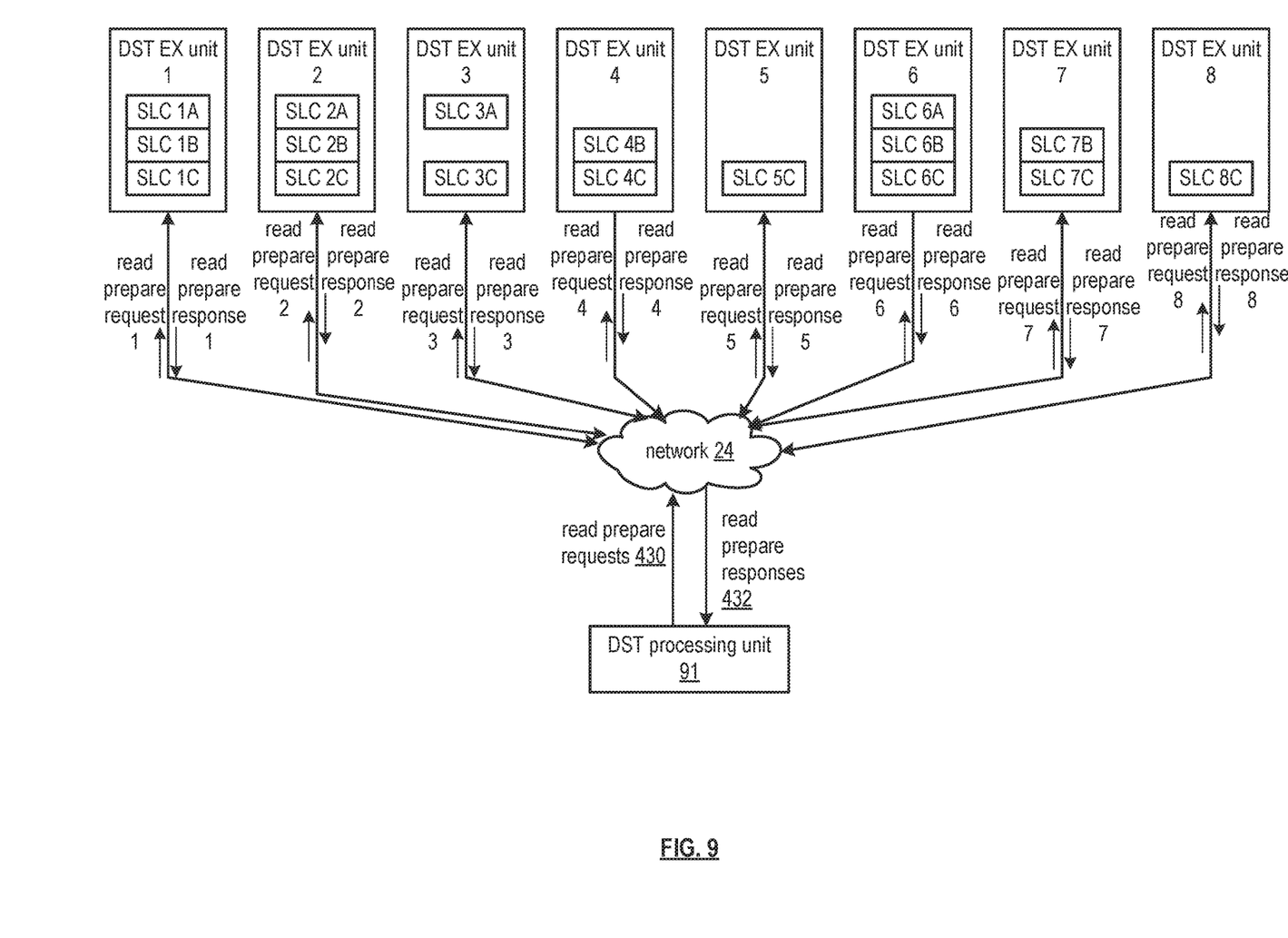
FIG. 9-10 are schematic block diagrams of embodiments of a dispersed storage network (DSN) in accordance with the present invention.
Figure 10:
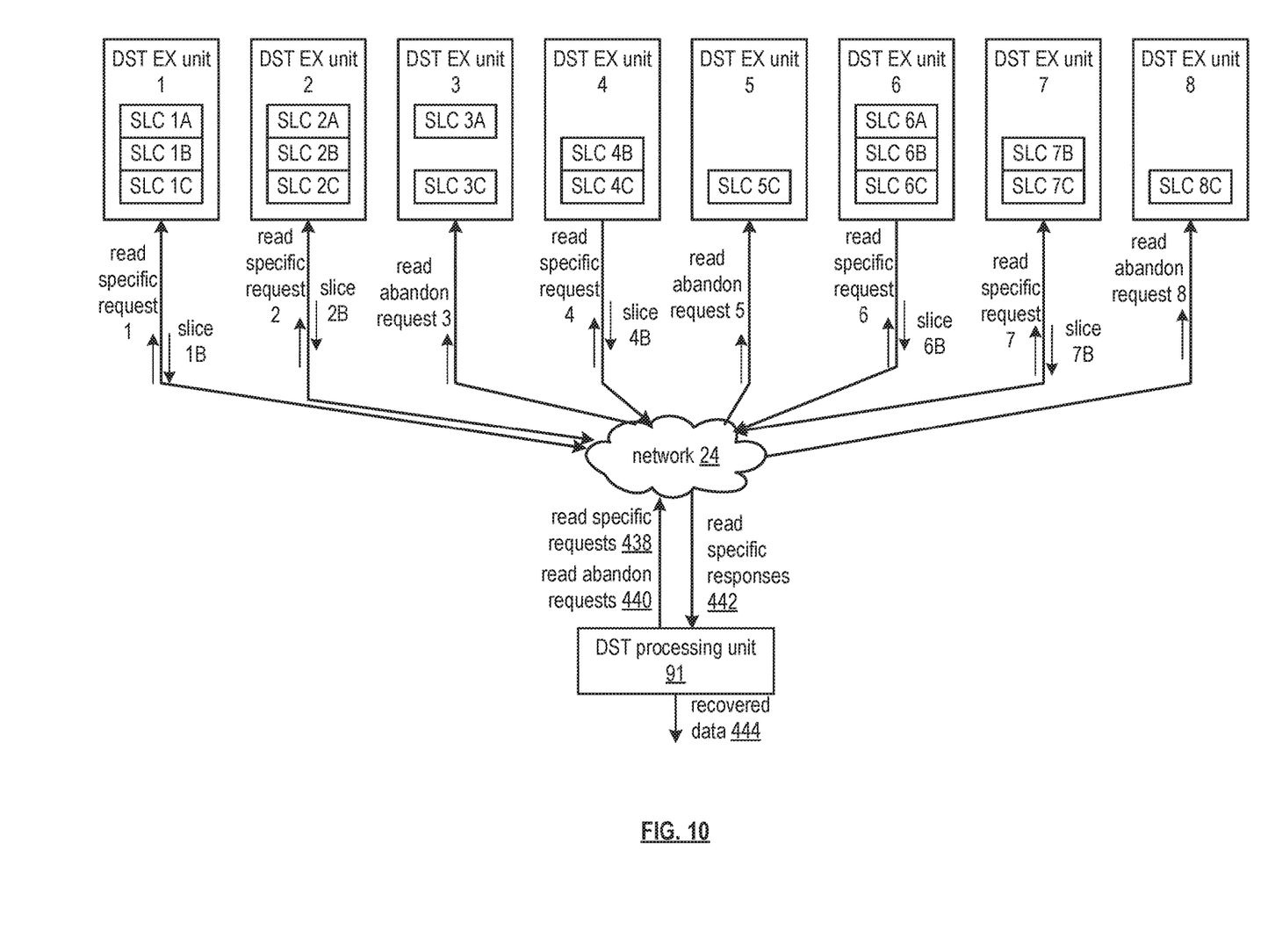
Figure 11:
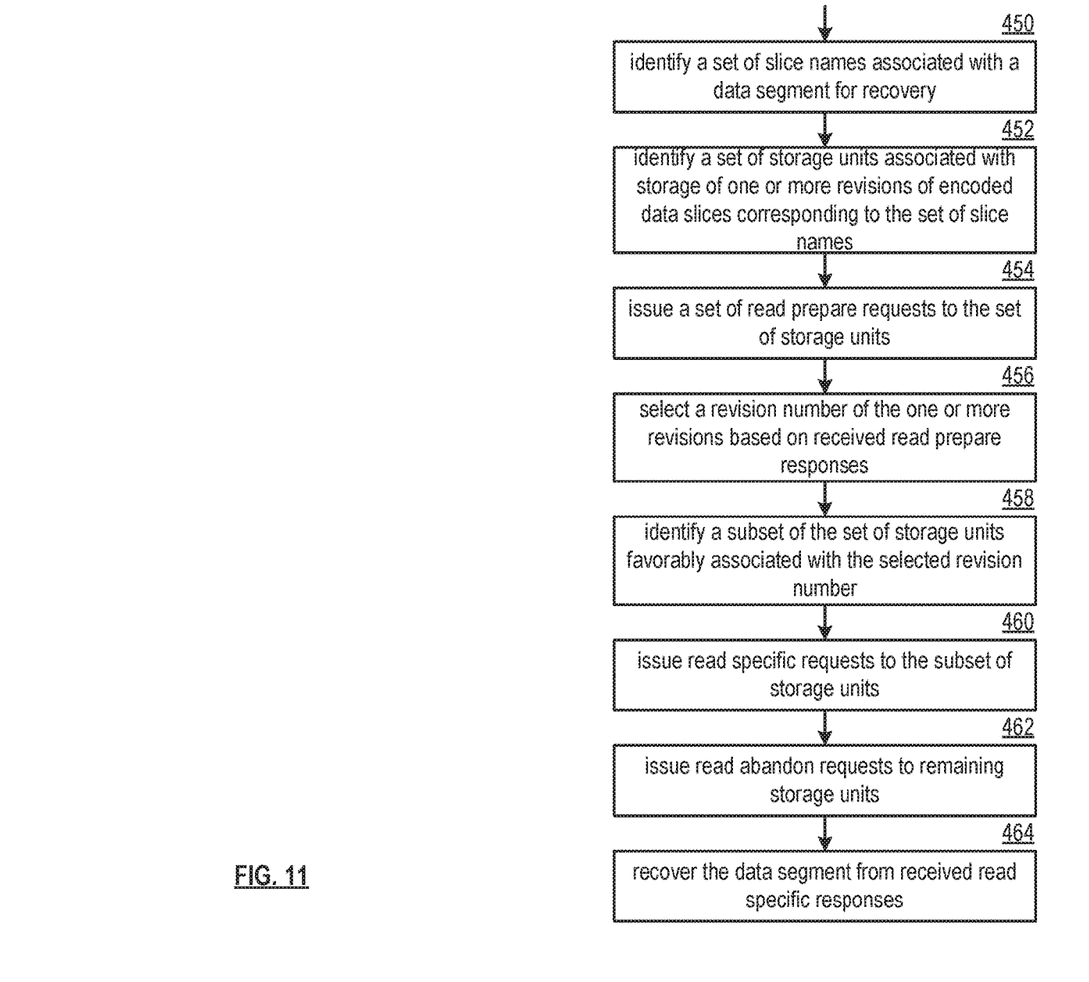
FIG. 11 is a flowchart illustrating an example of recovering stored data in accordance with the present invention.

Referring next to FIGS. 9-11, various embodiments, in which read prepare requests are sent to multiple memories, but not all memories that receive the read compare requests necessarily receive read complete requests, will be discussed. In various memory storage systems, read requests operate in a single step, to either return data or to fail. This creates a conundrum when throughput is both at an absolute premium but read operations must also succeed in a timely manner. Also, reads may succeed from the ds unit's perspective, e.g. by having data and returning it, yet fail from the perspective of the ds processing unit, or requesting device. For example, the ds processing unit may require certain slices at the latest revisions which are still restorable.

Further, the result of a read or check request are not guaranteed to be consistent from time to time, and so a Check Request sent at time T, may not represent the state at a future time T+e when Reads are issued. To ensure the same level of consistency present in writes, which are typically composed of separate write and commit phases, much can be gained by composing read operations into two phases, referred to herein as Read-Prepare and Read-Complete.

Various embodiments disclosed herein can address various issues in conventional systems by employing two new protocol messages: Read-Prepare, and Read-Complete. Read-Prepare has similar semantics to a Check request: it specifies a slice name to get information on regarding the current revisions, and this information is returned. However, Read-Prepare tells the ds unit to do some extra things: load the data and verify its integrity (if integrity information is available), and further, to hold the data in memory temporarily.

The response returned to the ds processing unit will be an error if the ds unit could not read the data or if the integrity did not check out, otherwise it will be equivalent to a check response, containing the names and revisions of all slices the store holds for that slice name, except that the "checked" data will be stored in a memory of the ds unit. The ds processing unit can then make a determination, based on the Read-Prepare Responses, about which stores have the latest restorable revisions, and then issue Read Complete requests to those ds units.

The Read-Complete request instructs the ds unit to return the data that was previously loaded into temporary memory, which has a benefit of preventing distributed storage memory device errors from impacting the ds unit's ability to respond to this request. Further, the data stored in the temporary memory will not be subject to IO/throughput restrictions on the distributed storage memory device, so latency/response time will be more predictable. As an additional enhancement, in some embodiments the Read-Complete request may indicate only a specific revision to return. Requesting return of specific revisions, even though more revisions may be stored in the temporary memory, can avoid using tying up extra bandwidth that would otherwise be wasted sending revisions which are not important to the ds processing unit. After the ds unit receives and responds to the Read Complete request, it frees that data loaded into the temporary memory.

When the ds processing unit succeeds in its read operation across the ds units, it then issues "Read Abandon" requests to the other ds units, loosely analogous to rolling back write operations, which tells the other ds unit to free the slices from temporary memory. If the ds processing unit ends its session (e.g. disconnects) from the ds units without issuing the Read Abandon request, in various embodiments the ds units will automatically abandon them. This approach keeps bandwidth usage to an absolute minimum, by never having to transfer data the ds processing unit would ultimately not use.

FIG. 9-10 are schematic block diagrams of embodiments of a dispersed storage network (DSN) that includes a set of distributed storage and task (DST) execution (EX) units, the network 24 of FIG. 1, and the DST processing unit 91, such as computing device 16 of FIG. 1. The set of DST execution units includes a number of DST execution units in accordance with an information dispersal algorithm (IDA) width. For example, when the IDA width is 8, a set of DST execution units includes DST execution units 1-8. Each DST execution unit may be implemented utilizing storage unit 36 of FIG. 1.

The DSN functions to recover data, where the data is divided into a plurality of data segments, where each data segment is associated with a revision number of the data, and each data segment is dispersed storage error encoded to produce a corresponding set of encoded data slices of a plurality of sets of encoded data slices, where each set of encoded data slices is stored in the set of DST execution units, and where each encoded data slice is associated with a unique slice name and with the revision number of the data. For example, the DST processing unit 91 generates and stores a set of slices (SLC) 1A, 2A, through 8A of a revision A of the data, another set of slices (SLC) 1B, 2B, through 8B of a revision B of the data, and yet another set of slices (SLC) 1C, 2C, through 8C of a revision C of the data, where each of the revisions A-C are stored in the set of DST execution units 1-8. Subsequent to the storage of the encoded data slices, one or more of the encoded data slices may be unavailable (e.g., corruption, missing, destroyed, inadvertently deleted, etc.). For example, the version A encoded data slices may only include encoded data slices 1, 2, 3, and 6; the version B encoded data slices may only include encoded data slices 1, 2, 4, 6, and 7; and the version C encoded data slices may include the entire set of encoded data slices 1-8 and a common subsequent time frame.

FIG. 9 illustrates steps of an example of operation of the recovering of the stored data, where the DST processing unit 91 identifies a data segment of the plurality of data segments for recovery. The identifying includes at least one of receiving a retrieve data request for the data, receiving a retrieve data request for the data segment, and identifying the data segment of the plurality of data segments for recovery. For example, the DST processing unit 91 identifies a next sequential data segment as the data segment for recovery.

Having identified the data segment for recovery, the DST processing unit 91 identifies a set of DST execution units. The identifying includes at least one of performing a lookup based on an identifier of the data segment, interpreting system registry information, and receiving DST execution unit identifiers. Having identified the set of DST execution units, the DST processing unit 91 issues a set of read prepare requests 430 to the set of identified DST execution units. The issuing includes generating the read prepare requests 430 to include a set of slice names corresponding to a set of encoded data slices of the data segment and sending, via the network 24, the set of read prepare requests 430 to the set of DST execution units. For example, the DST processing unit 91 generates and sends, via the network 24, read prepare requests 1-8 to the DST execution units 1-8.

Having sent the set of read prepare requests 430 to the set of identified DST execution units, the DST processing unit 91 receives read prepare responses 432, via the network 24, from at least some DST execution units of the set of DST execution units, where the read prepare responses 432 indicates, for each available encoded data slice, an associated slice name and revision number. For example, each DST execution unit copies, for each slice name, each revision of an available encoded data slice to a temporary memory (e.g., a high-speed memory to enable subsequent output) and issues a corresponding read prepare response to the DST processing unit 91. As a specific example, DST execution unit 1 receives the read prepare request 1 that includes a first slice name common to encoded data slices 1A, 1B, and 1C of respective revisions A-C, copies the encoded data slices 1A-1C from a primary memory (e.g., a magnetic disk drive) into the temporary memory (e.g., a solid-state memory) of the DST execution unit 1, and issues a read prepare response 1 to the DST processing unit 91, where the read prepare response 1 indicates that the encoded data slices are available for revisions A-C of the first slice name.

FIG. 10 illustrates further steps of the example of operation of the recovering of the stored data, where the DST processing unit 91 identifies, for each available revision of encoded data slices, a desired revision number for recovery based on a number of available encoded data slices associated with each available revision number. The identifying includes one of identifying a most recent revision number associated with at least a decode threshold number of encoded data slices and identifying a most recent revision number associated with at least a read threshold number of encoded data slices. For example, the DST processing unit 91 determines that the set of encoded data slices associated with the revision A does not include at least a decode threshold number of encoded data slices when the decode threshold is 5 (e.g., only four slices are available—encoded data slices 1A, 2A, 3A, and 6A). As another example, the DST processing unit 91 determines that the set of encoded data slices associated with the revision B includes a decode threshold number of encoded data slices (e.g., slices 1B, 2B, 4B, 6B, 7B) and so does the set of encoded data slices associated with the revision C, and chooses the revision B as a desired revision number for recovery when determining that revision B is newer than revision C and a latest revision number is desired. Alternatively, the DST processing unit 91 may select the revision C when an oldest revision number is desired.

Having identified the desired revision number for recovery, the DST processing unit 91 identifies a subset of DST execution unit set includes at least a decode threshold number of DST execution units associated with available encoded data slices of the desired revision number. The identifying may be based on one or more of interpreting the read prepare responses, interpreting a predetermination, interpreting system registry information, and analyzing DST execution unit performance level information. For example, the DST processing unit 91 selects the DST execution units 1, 2, 4, 6, and 7 as the subset of DST execution units when the DST execution units 1, 2, 4, 6, and 7 include the decode threshold number of encoded data slices of the desired revision number for recovery and the DST execution units 1, 2, 4, 6, and 7 are associated with favorable DST execution unit performance levels.

Having selected the subset of DST execution units, the DST processing unit 91 issues read specific requests 438 to the identified subset of DST execution units. The issuing includes generating the read specific requests 438 to include the desired revision number and associated slice name of the set of slice names, sending, via the network 24, the read specific requests to the identified subset of DST execution units and receiving a corresponding encoded data slices of the desired revision number for recovery. For example, DST execution unit 1 receives a read specific request 1 that includes the revision number B and sends, via the network 24, a read specific response 442 that includes the encoded data slice 1B to the DST processing unit 91. When the DST processing unit 91 receives at least a decode threshold number of encoded data slices associated with the desired revision from the identified subset of DST execution units, the DST processing unit 91 dispersed storage error decodes the received decode threshold number of encoded data slices to produce a recovered data segment of a plurality of recovered data segments, where the plurality of recovered data segments produces recovered data 444.

Having issued the read specific requests 438, the DST processing unit 91 issues read abandon requests 440 to remaining DST execution units of the set of DST execution units. The issuing includes generating the read abandon requests 440 to include a remaining associated slice name of the set of slice names, and sending, via the network 24, the read abandon requests 440 to the remaining DST execution units. Each DST execution unit receiving the read abandon request 440 deletes all revisions of encoded data slices of the associated slice name from the temporary memory of the DST execution unit. For example, the DST execution unit 3 receives a read abandon request 3 and deletes encoded data slices 3A and 3C from the temporary memory of the DST execution unit 3.

FIG. 11 is a flowchart illustrating an example of recovering stored data. The method includes step 450 where a processing module (e.g., of a distributed storage and task (DST) processing unit) identifies a set of slice names associated with a data segment for recovery. The identifying includes at least one of accessing a DSN directory to identify slice names associated with a data identifier of the data segment and accessing a dispersed hierarchical index to identify the slice names.

The method continues at step 452 where the processing module identifies a set of storage units associated with storage of one or more revisions of encoded data slices corresponding to the set of slice names. The identifying includes at least one of accessing the DSN directory and accessing the dispersed hierarchical index to identify storage units associated with storage of encoded data slices of the slice names.

The method continues at step 454 where the processing module issues a set of read prepare requests to the set of storage units. For example, the processing module generates the set of read prepare requests to include the set of slice names and sends the set of read prepare requests to the set of storage units. The method continues at step 456 where the processing module selects a revision number of the one or more revisions based on received read prepare responses. For example, the processing module receives the read prepare responses, interprets the received responses to identify available revisions of encoded data slices, interprets responses to identify a favorable number of available encoded data slices for each revision of the one or more revisions, and chooses a revision number associated with a desired number of available encoded data slices (e.g., a decode threshold number, a read threshold number).

The method continues at step 458 where the processing module identifies a subset of the set of storage units favorably associated with the selected revision number. For example, the processing module interprets the read prepare responses to identify storage units associated with the desired revision and chooses from the storage units associated with a desired revision that are associated with favorable performance levels.

The method continues at step 460 where the processing module issues read specific requests to the subset of storage units. For example, the processing module generates the read specific requests to include one or more of an associated slice name of the set of slice names and the desired revision number. The method continues at step 462 where the processing module issues read abandon requests to remaining storage units of the set of storage units. For example, the processing module generates the read abandon requests to include one or more of a remaining associated slice name of the set of slice names.

The method continues at step 464 where the processing module recovers the data segment from received read specific responses. For example, the processing module dispersed storage error decodes a decode threshold number of encoded data slices of the set of encoded data slices to produce a recovered data segment. Alternatively, or in addition to, the processing module repeats the process to recover further data segments for aggregation to produce recovered data.

It is noted that terminologies as may be used herein such as bit stream, stream, signal sequence, etc. (or their equivalents) have been used interchangeably to describe digital information whose content corresponds to any of a number of desired types (e.g., data, video, speech, audio, etc. any of which may generally be referred to as 'data').

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may also be used herein, the terms "processing module", "processing circuit", "processor", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributively located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue"

indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A method for use in a distributed storage network (DSN) employing a plurality of storage units, the plurality of storage units including a plurality distributed storage (DS) memories for dispersed storage of encoded data slices, the method comprising:
   transmitting, from a requesting device to the plurality of storage units, a read-prepare request, the read-prepare request initiating a first phase of a multi-phase read operation, and specifying a slice name of an encoded data slice, and instructing the plurality of storage units to:
      attempt to retrieve, from dispersed storage, one or more data slices associated with the slice name;
      temporarily store the one or more data slices in a memory, rather than transmitting the one or more data slices to the requesting device;
   receiving from the plurality of storage units, at the requesting device, read-prepare responses, the read-prepare responses including either an error indication indicating that the storage unit was unable to retrieve one or more valid data slices from dispersed storage, or names and revisions of the one or more valid data slices actually retrieved from dispersed storage;
   selecting, at the requesting device, a subset of the plurality of storage units based on the read-prepare responses;
   transmitting, from the requesting device to the subset of the plurality of storage units, a read-complete request the read-complete request initiating a second phase of the multi-phase read operation, and instructing the subset of the plurality of storage units to return the one or more data slices temporarily stored in the memory to the requesting device.

2. The method of claim 1, further comprising:
   transmitting, from the requesting device to other storage units not selected for inclusion in the subset of the plurality of storage units, a read-abandon request, the read-abandon request instructing the other storage units to free the one or more data slices temporarily stored.

3. The method of claim 1, further comprising:
   receiving, from the plurality of storage units, at the requesting device, at least a subset of the one or more valid data slices actually retrieved from dispersed storage.

4. The method of claim 1, further comprising:
   recovering a data segment from the at least a subset of the one or more valid data slices.

5. The method of claim 1, further comprising:
   generating the read-complete request to include:
      information identifying a specific revision of the slice name specified in the read-prepare request; and
      information indicating that the subset of the plurality of storage units are to return particular data slices matching the specific revision.

6. The method of claim 5, further comprising:
   selecting the specific revision based, at least in part, on information included in the read-prepare responses indicating that a desired number of encoded data slices are available from the subset of the plurality of storage units.

7. The method of claim 6, further comprising:
   selecting the subset of the plurality of storage units based, at least in part, on information included in the read-prepare responses indicating which storage units retrieved valid data slices matching the information identifying a specific revision.

8. A processing unit for use in a distributed storage network (DSN) employing a plurality of storage units, the plurality of storage units including a plurality distributed storage (DS) memories for dispersed storage of encoded data slices, the processing unit comprising:
   a processor and associated memory;
   a network interface coupled to the processor and associated memory;
   the processor and associated memory configured to transmit to the plurality of storage units, via the network interface, a read-prepare request, the read-prepare request initiating a first phase of a multi-phase read operation, and specifying a slice name of an encoded data slice, and instructing the plurality of storage units to:
   attempt to retrieve, from dispersed storage, one or more data slices associated with the slice name;
   temporarily store the one or more data slices in a memory, rather than transmitting the one or more data slices to the processing unit;
the processor and associated memory further configured to receive from the plurality of storage units, via the network interface, read-prepare responses, the read-prepare responses including either an error indication indicating that the storage unit was unable to retrieve one or more valid data slices from dispersed storage, or names and revisions of the one or more valid data slices actually retrieved from dispersed storage;
the processor and associated memory further configured to select a subset of the plurality of storage units based on the read-prepare responses;
the processor and associated memory further configured to transmit, to the subset of the plurality of storage units, a read-complete request, the read-complete request initiating a second phase of the multi-phase read operation, and instructing the subset of the plurality of storage units to return the one or more data slices temporarily stored in the memory to the processing unit.

9. The processing unit of claim 8, the processor and associated memory further configured to:
   transmit, to other storage units not selected for inclusion in the subset of the plurality of storage units, a read-abandon request, the read-abandon request instructing the other storage units to free the one or more data slices temporarily stored.

10. The processing unit of claim 8, the processor and associated memory further configured to:
   receive, from the plurality of storage units, at least a subset of the one or more valid data slices actually retrieved from dispersed storage.

11. The processing unit of claim 8, the processor and associated memory further configured to:
   recover a data segment from the at least a subset of the one or more valid data slices.

12. The processing unit of claim 8, the processor and associated memory further configured to:
   generate the read-complete request to include:
     information identifying a specific revision of the slice name specified in the read-prepare request; and
     information indicating that the subset of the plurality of storage units are to return particular data slices matching the specific revision.

13. The processing unit of claim 12, the processor and associated memory further configured to:
   select the specific revision based, at least in part, on information included in the read-prepare responses indicating that a desired number of encoded data slices are available from the subset of the plurality of storage units.

14. The processing unit of claim 13, the processor and associated memory further configured to:
   select the subset of the plurality of storage units based, at least in part, on information included in the read-prepare responses indicating which storage units retrieved valid data slices matching the information identifying a specific revision.

15. A distributed storage network (DSN), comprising:
a plurality of storage units, the plurality of storage units including a plurality distributed storage (DS) memories for dispersed storage of encoded data slices;
a processing unit including a processor, a memory, and a network interface, the processing unit configured to:
   transmit, to the plurality of storage units, a read-prepare request, the read-prepare request initiating a first phase of a multi-phase read operation, and specifying a slice name of an encoded data slice, and instructing the plurality of storage units to:
     attempt to retrieve, from dispersed storage, one or more data slices associated with the slice name;
     temporarily store the one or more data slices in a memory, rather than transmitting the one or more data slices to the processing unit;
   receive, from the plurality of storage units, via the network interface, read-prepare responses, the read-prepare responses including either an error indication indicating that the storage unit was unable to retrieve one or more valid data slices from dispersed storage, or names and revisions of the one or more valid data slices actually retrieved from dispersed storage;
   select a subset of the plurality of storage units based on the read-prepare responses;
   transmit, to the subset of the plurality of storage units, a read-complete request, the read-complete request initiating a second phase of the multi-phase read operation, and instructing the subset of the plurality of storage units to return the one or more data slices temporarily stored in the memory to the processing unit.

16. The distributed storage network (DSN) of claim 15, the processing unit further configured to:
   transmit, to other storage units not selected for inclusion in the subset of the plurality of storage units, a read-abandon request, the read-abandon request instructing the other storage units to free the one or more data slices temporarily stored.

17. The distributed storage network (DSN) of claim 15, the processing unit further configured to:
   receive, from the plurality of storage units, at least a subset of the one or more valid data slices actually retrieved from dispersed storage.

18. The distributed storage network (DSN) of claim 15, the processing unit further configured to:
   recover a data segment from the at least a subset of the one or more valid data slices.

19. The distributed storage network (DSN) of claim 15, the processing unit further configured to:
   generate the read-complete request to include:
     information identifying a specific revision of the slice name specified in the read-prepare request; and
     information indicating that the subset of the plurality of storage units are to return particular data slices matching the specific revision.

20. The distributed storage network (DSN) of claim 19, the processing unit further configured to:
   select the specific revision based, at least in part, on information included in the read-prepare responses indicating that a desired number of encoded data slices are available from the subset of the plurality of storage units.

\* \* \* \* \*